April 8, 1969 W. W. O'CONNOR 3,437,838
DUAL TRANSISTOR CURRENT LIMITER
Filed May 25, 1966
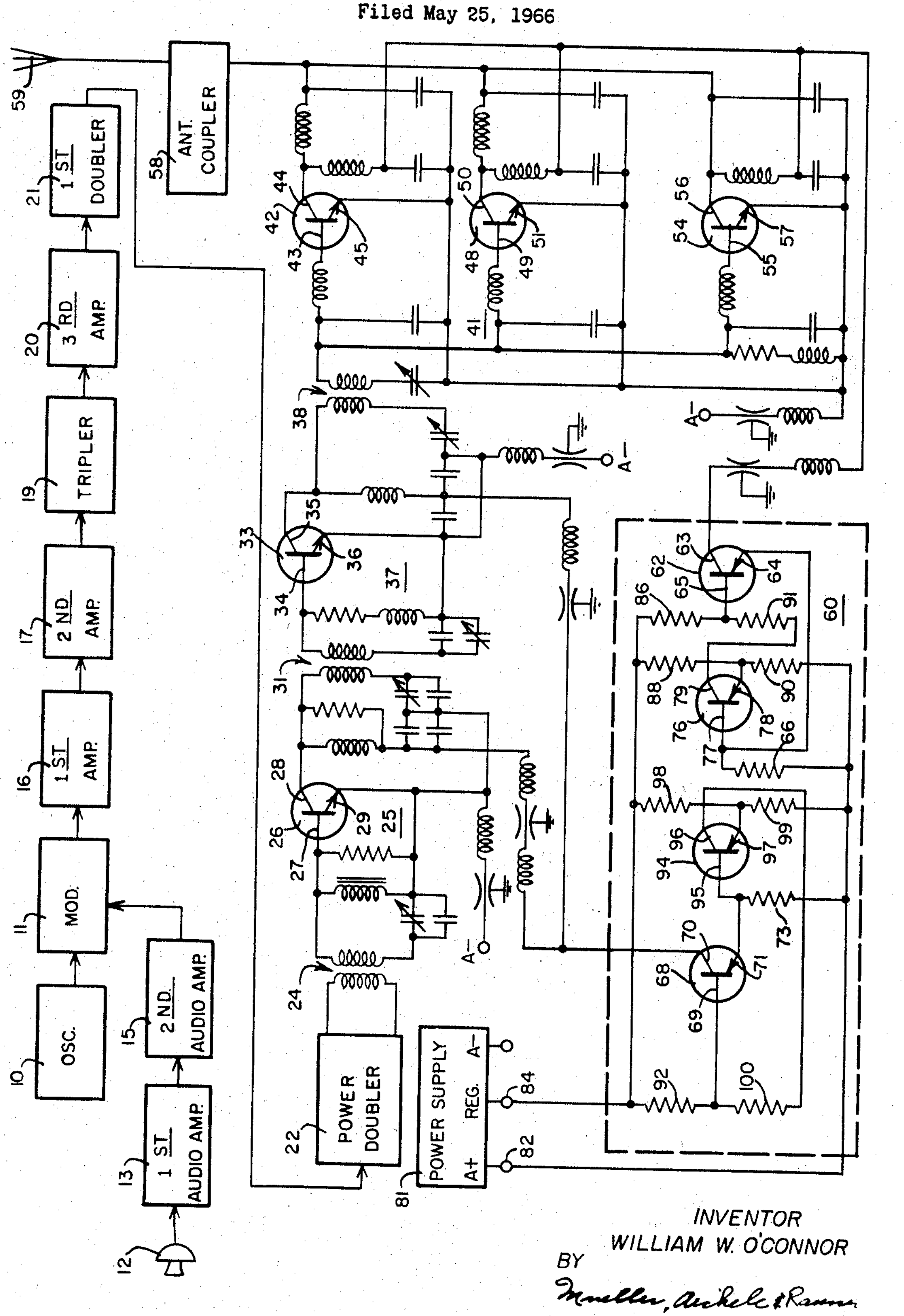
INVENTOR
WILLIAM W. O'CONNOR
BY
Mueller, Aichele & Rauner
ATTYS.

United States Patent Office 3,437,838

Patented Apr. 8, 1969

3,437,838
DUAL TRANSISTOR CURRENT LIMITER

William W. O'Connor, Chicago, Ill., assignor to Motorola, Inc., Franklin Park, Ill., a corporation of Illinois Filed May 25, 1966, Ser. No. 552,973
Int. Cl. H03k *5/08;* H02h *7/20*
U.S. Cl. 307—237 7 Claims This invention relates to a current limiter for transistor circuits, and in particular to a dual transistor current limiter.

Many electronic devices operating into a variable impedance load as, for example, transistors and other semiconductor devices used in the output circuits of carrier wave transmitters, are subject to damage or destruction by excessive current. Excessive current can be caused by a drop in the impedance that the transistor presents to its power supply. The impedance of transistors can change during tuning and with changes in the load impedance coupled to the transistor. For example, the impedance of the antenna load of a final amplifier transistor of a carrier wave transmitter may change if the antenna is removed, or strikes an object such as a tree or bush. The changes in the impedance of the load on the transistor amplifier can cause the transistor impedance to decrease to a value which will result in the transistor drawing excessive current from the power supply. If the current through the transistor is sufficiently high, the transistor can be destroyed.

In prior art circuits the current through the output transistor amplifiers has been regulated by using a suitably controlled limiting transistor to supply the operating current to the output amplifier transistors. A control current is developed which is used to bias a limiting transistor to maintain the operating current below a predetermined maximum value. Normally both the current to the output amplifiers and to the driver amplifiers is controlled in this manner so that the drive signal amplitude to the output amplifier is reduced when the output amplifier transistors attempt to draw a heavy load. The action of the current limiters should be automatic so that as high an output power as possible can be maintained consistent with safe operation of the transistors.

In operation the current gain or transconductance of the limiting transistors should have little effect on the limiting level, and the limiting level should also remain relatively constant with changes in the load on the limiting transistor. Preferably the limiting level should be maintained at a relatively constant value over a large temperature range so that the transistor limiter need not be temperature compensated. Because of the inherent differences in similar transistors as presently manufactured, it is desirable that the limiting circuit be such that large variations in the limiting level from unit to unit are minimized.

It is, therefore, an object of this invention to provide an improved current limiting circuit for protecting amplifier transistors from damage due to excessive current.

Another object of this invnetion is to provide a current limiting circuit for transistor protection in which the transconductance of the transistors used in the limiting circuit have a minimal effect on the limiting level.

Another object of this invention is to provide a current limiting circuit for protecting transistors in which the limiting level remains relatively constant with changes in the load protected by the limiting circuit.

Another object of this invention is to provide a current limiting protective circuit for transistors which will act over a large temperature range without temperature compensation.

A further object of this invention is the provision of a current limiting protective circuit for transistors in which the limiting level from unit to unit is maintained substantially constant.

A feature of this invention is the provision of a current limiting circuit for protecting transistors in which supply current to the transistors to be protected is provided through a current regulating transistor having resistance coupled in series therewith.

Another feature of this invention is the provision of a current limiting circuit for protecting transistors in which a bias potential or the current regulating transistor is provided to maintain the same in a saturated condition during normal operation.

Another feature of this invention is the provision of a current limiting circuit for protecting transistors in which a second transistor having a control electrode coupled to the resistance is provided. The second transistor is coupled to the control electrode of the current regulating transistor to change the bias potential when the current flowing through the high powered transistor reaches a predetermined level, to thereby reduce the conduction of the high powered transistor and limit the current supplied to the transistor being protected.

The invention is illustrated in the single drawing, a partial block diagram and partial schematic of a transmitter incorporating the features of the invention.

In practicing this invention, operating current for a transistor is provided through a current regulating transistor connected in series with the transistor, resistance means, and the power supply. The control electrode of the current regulating transistor receives a bias potential which maintains the current regulating transistor in a saturated condition. A control transistor is provided having one electrode biased at a predetermined level and a control electrode coupled to the resistance means. The output electrode of the second transistor is coupled to the control electrode of the current regulating transistor. In normal operation the control transistor is biased off so that it does not affect the operation of the current regulating transistor.

As the current flowing through the current limiting transistor and the resistance means increases beyond a predetermined level the potential developed across the resistance means acts to bias the control transistor to conduction. With the control transistor conducting, the bias potential on the control electrode of the current regulating transistor is changed to reduce its conduction and thereby limit the current flowing through the current regulating transistor to the transistor to be protected.

The invention is illustrated in the single drawing, a partial block diagram and partial schematic of a transmitter incorporating the features of the invention. A high frequency signal is developed by oscillator 10 and coupled to modulator 11. Speech signals are converted into electrical signals by microphone 12, amplified in audio amplifiers 13 and 15, and coupled to modulator 11 to modulate the high frequency signals from oscillator 10. The modulated signal is amplified in first amplifier 16 and second amplifier 17. The frequency is tripled in tripler 19 and the signal is further amplified in third amplifier 20. The frequency of the output signal from amplifier 20 is doubled in first doubler 21 and again doubled in power doubler 22.

The output signal from power doubler 22 is coupled to driver amplifier 25 through transformer 24 which couples the signal to base 27 of transistor 26. The output signal from collector 28 of transistor 26 is coupled to base 34 of transistor 33 through transformer 31. The output of driver amplifier 37 is coupled to power amplifier 41, which comprises three transistors 42, 48 and 54, coupled in parallel. Collector 44 of transistor 42, collector 50 of transistor 48, and collector 56 of transistor 54 are coupled in parallel to antenna 59 through antenna coupling circuit 58.

In order to provide the maximum power output from the transmitter, transistors 42, 48 and 54 are operated as close as possible to their maximum power ratings. The load presented to the transistors is determined by the output circuits, the antenna coupling circuit 58 and antenna 59. During tuning the load presented to the transistor may become very low, causing the transistors to draw excessive current. In addition, the impedance presented to the transistors can change if antenna 59 strikes a bush or tree or is disconnected from the circuit, all of which are common occurrences in mobile transmitter operation. Further, signals from nearby stations are picked up by antenna 59 and coupled back to the collectors 44, 50 and 56 of transistors 42, 48 and 54, even if the nearby stations are tuned to different frequencies. The signals from the nearby stations, which may appear on the collectors of transistor 42, transistor 48 and transistor 54, when added to the signal generated by the transmitter, may be sufficient to cause a voltage breakdown of the transistors and thereby cause them to draw excessive current.

In order to limit the current drawn by the power amplifier transistors and also by the driver and pre-driver transistors, a current limiting circuit 60 is provided. In operation a current is provided from the A+ terminal 82 of power supply 81, through resistor 66, emitter 64 and collector 63 of transistor 62 to collectors 44, 50 and 56 of transistors 42, 48 and 54.

A bias current for transistor 62 is provided from A+ terminal 82 through resistor 66, emitter 64 and base 65 of transistor 62, and resistor 86 to the regulated minus supply terminal 84 of power supply 81. The value of resistor 86 is chosen so as to provide a bias current of suffiicient magnitude to bias transistor 62 to saturation.

Thus, in normal operation transistor 62 presents a low impedance to the operating current supplied to the power amplifier transistors and there is no limiting action.

Control transistor 76 is normally biased to non-conduction since base 77 of transistor 76 is coupled to A+ terminal 82 through resistor 66, which is of small value, and emitter 78 of transistor 76 is established at a fixed bias potential by voltage divider resistors 88 and 90 coupled between the regulated supply terminal 84 and the A+ terminal 82. Since resistor 66 is of small value, the normal operating current drawn by power amplifier 41 is not sufficient to change the potential of base 77 to bias transistor 62 to conduction. However, as the current drawn by power amplifier 41 increases, the potential on base 77 of transistor 76 is reduced to a point where transistor 76 is biased to conduction. At this level, which is determined by the maximum allowable current for the transistors of power ampilfier 41, the conduction of transistor 76 provides a path for the flow of current from A+ terminal 82 through resistor 90, emitter 78 and collector 79 of transistor 76, resistor 91 and resistor 86 to regulated terminal 84. The flow of current through transistor 76 and resistors 91 and 86 raises the bias potential on base 65 of transistor 62, biasing transistor 62 toward non-conduction. As transistor 62 is biased toward non-conduction the resistance of transistor 62 to the flow of current to power amplifier 41 is increased. This increase in the resistance of transistor 62 acts to limit the current, which may be drawn by power amplifier 41, to a safe value.

A similar limiter circuit is provided to supply operating current to driver amplifier stage 37 and pre-driver amplifier stage 25, as the transistors of these stages may also be subject to destructive currents due to changes in the power amplifier circuit. Transistor 68 is normally biased to saturation by a bias current from A+ terminal 82 through resistor 73, emitter 71 and base 69 of transistor 68 and resistor 92 to regulated supply terminal 84. Transistor 94 has a fixed bias applied to emitter 97 from voltage divider resistors 98 and 99 connected between regulated supply terminal 84 and A+ terminal 82. The potential appearing on base 95 of transistor 94 is determined by the flow of current through resistor 73, and for normal operating current the potential appearing on base 95 is not sufficient to bias transistor 94 to conduction. However, when the flow of current through resistor 73 to pre-driver amplifier 25 and driver amplifier 37 reaches the maximum allowable value, the potential on base 95 of transistor 94 reaches a magnitude which will bias transistor 94 to conduction. At this point, current flows from A+ terminal 82 through resistor 99, emitter 97 and collector 96 of transistor 94, resistor 100 and resistor 92 to regulated terminal 84. The flow of current through transistor 84 and resistors 100 and 92 raises the bias potential on base 69 of transistor 68, biasing transistor 68 toward non-conduction. As transistor 68 is biased toward non-conduction, the resistance of transistor 68 to the flow of current to pre-driver 25 and driver 37 is increased. This increase in the resistance of transistor 68 acts to limit the current which may be drawn by pre-driver 25 and driver 37 to a safe value.

Thus, a dual transistor current limiter for an ampifier has been shown. The current limiter is automatic in operation and does not act to limit the operating current supply to the amplifier stages until the current reaches a maximum allowable value. By using the dual transistor current limiter, the transconductance of the limiting transistor has little effect on the limiting level. The limiting level remains relatively consant with changes in load and over a large temperature range. Because of the feedback effect of using the dual transistor current limiters there is little variation in the limiting level as from unit to unit with different transistors.

I claim:

1. A protection circuit for a semiconductor device including in combination, current regulating transistor means having an output electrode coupled to the semiconductor device, an input electrode and a control electrode, first and second input terminals adapted to receive a direct current potential, resistance means coupling said first input terminal to said input electrode, first bias network means coupled to said control electrode of said current regulating transistor means to establish a particular first bias potential thereat whereby said current regulating transistor means provides operating current to the semiconductor device with said operating current flowing through said resistance means to generate a control potential thereacross, proportional to the magnitude of said operating current, control transistor means having a control electrode coupled to said resistance means, a first electrode coupled to said first bias network means and a second electrode, second bias network means coupled to said first and second input terminals and said second electrode for establishing a second bias potential thereat whereby said control transistor means is biased to non-conduction, said control transistor means being responsive to said control potential above a predetermined magnitude to become conductive and thereby to develop a control signal, said first bias network being responsive to said control signal to change said first bias potential whereby the magnitude of said operating current is limited to a safe value.

2. The protection circuit of claim 1 wherein said direct current potential applied to said first and second input terminals is regulated.

3. The protection circuit of claim 1 wherein said first bias network includes resistance means coupled to said second input terminal and to said control electrode of said current regulating transistor for providing a bias current of sufficient magnitude to bias said current regulating transistor to conduction.

4. The protection circuit according to claim 1 wherein said second bias network means includes first and second resistors series connected between said first and second input terminals, and circuit means coupling the junction of said first and second resistors to said second electrode.

5. The protective circuit of claim 1 wherein said current regulating transistor means includes a first transistor having a collector electrode coupled to the semiconductor device, an emitter electrode coupled to said resistance means and a base electrode, said first bias network means includes a first transistor coupling said second input terminal to said base electrode of said first transistor, said control transistor means includes a second transistor having a base electrode coupled to said resistance means, a collector electrode and an emitter electrode, a second resistor coupling said collector electrode of said second transistor to said base electrode of said first transistor, and said second bias network includes third and fourth resistors series connected between said first and second input terminals, and circuit means coupling the junction of said third and fourth resistors to said emitter electrode of said second transistor.

6. A protection circuit for a plurality of semiconductor devices, including in combination, a plurality of current regulating transistor means each having an output electrode coupled to at least one of the semiconductor devices, an input electrode and a control electrode, first and second input terminals adapted to receive a direct current potential, a plurality of resistance means each coupling said first input terminal to a separate one of said input electrodes, a plurality of first bias network means each coupled to a separate one of said control electrodes of said current regulating transistor means to establish a first bias potential thereat whereby each of said plurality of current regulating transistor means provides operating current to the semiconductor device coupled thereto with each of said plurality of operating current flowing through a separate one of said resistance means to generate separate control potentials thereacross proportional to the magnitude of said operating current flowing therethrough, a plurality of control transistor means each having a control electrode coupled to a separate one of said resistance means, a first electrode coupled to a separate one of said first bias network means and a second electrode, a plurality of second bias network means coupled to said first and second input terminals and to separate ones of said second electrodes for establishing second bias potentials thereat whereby each of said plurality of control transistor means is biased to non-conduction, each of said control transistor means being responsive to a separate one of said control potentials above a predetermined magnitude to become conductive and thereby to develop a control signal and to apply the same to the first bias network coupled thereto, each of said plurality of first bias networks being responsive to said control signal applied thereto to change said first bias potential developed thereby, whereby the magnitude of said operating current supplied by said current regulating transistor means coupled thereto is limited to a safe value.

7. A protection circuit for an electronic circuit including first, second and third semiconductor devices, including in combination, a first current regulating transistor having a collector electrode coupled to the first semiconductor device, an emitter electrode and a base electrode, a second current regulating transistor having a collector electrode coupled to the second and third semiconductor devices and an emitter electrode and a base electrode, first and second input terminals adapted to receive a direct current potential, first resistance means coupling said first input terminal to said emitter electrode of said first current regulating transistor, second resistance means coupling said first input terminal to said emitter electrode of said second current regulating transformer, first bias network means coupled to said base electrode of said first current regulating transistor to establish a particular first bias potential thereat whereby said first current regulating transistor provides a first operating current to the first semiconductor device, second bias network means coupled to said base electrode of said second current regulating transistor to establish a particular second bias potential thereat whereby said second current regulating transistor provides a second operating current to the second and third semiconductor devices, said first operating current flowing through said first resistor means and said second operating current flowing through said second resistance means acting to generate first and second control potentials thereacross proportional to the magnitude of said first and second operating currents respectively, first control transistor means having a base electrode coupled to said first resistance means, a collector electrode coupled to said base electrode of said first current regulating means and an emitter electrode, second control transistor means having a base electrode coupled to said second resistance means, a collector electrode coupled to said base electrode of said second current regulating transistor, and an emitter electrode, third bias network means coupled to said emitter electrode of said first control transistor and to said first and second input terminals for establishing a third bias potential thereat whereby said first control transistor is biased to non-conduction, fourth bias network means coupled to said first and second input terminals and said emitter electrode of said second control transistor for establishing a fourth bias potential thereat whereby said second control transistor is biased to non-conduction, said first and second control transistors being responsive to said first and second control potentials respectively above a predetermined magnitude to become conductive and thereby to develop first and second control signals respectively, said first bias network being responsive to said first control signal to change said first bias potential and said second bias network being responsive to said second control signal to change said second bias potential whereby the magnitudes of said first and second operating currents are limited to a safe value.

References Cited

UNITED STATES PATENTS

| | | | |
|---|---|---|---|
| 3,106,680 | 10/1963 | Delong et al. ______ | 325—151 |
| 3,281,697 | 10/1966 | Hansen et al. ____ | 307—237 XR |
| 3,365,675 | 1/1968 | Gaddy et al. ________ | 325—151 |

ARTHUR GAUSS, *Primary Examiner.*

B. P. DAVIS, *Assistant Examiner.*

U.S. Cl. X.R.

307—202; 325—151